United States Patent [19]
Keren et al.

[11] Patent Number: 4,792,759
[45] Date of Patent: Dec. 20, 1988

[54] MULTI-FREQUENCY SURFACE PROBE

[75] Inventors: Hanan Keren, Kfar Saba; Itzchak Linnenberg, Netanya, both of Israel

[73] Assignee: Elscint Ltd., Haifa, Israel

[21] Appl. No.: 78,895

[22] Filed: Jul. 29, 1987

[51] Int. Cl.$^4$ .............................................. G01R 33/20
[52] U.S. Cl. ..................................... 324/322; 333/32; 324/318
[58] Field of Search ............... 324/318, 322, 311, 307; 333/32

[56] References Cited

U.S. PATENT DOCUMENTS

| | | | |
|---|---|---|---|
| 3,858,112 | 12/1974 | Satoh et al. | 324/322 |
| 4,021,726 | 5/1977 | Garroway et al. | 324/309 |
| 4,075,552 | 2/1978 | Traficante et al. | 324/322 |
| 4,129,822 | 12/1978 | Traficante | 324/322 |
| 4,446,431 | 5/1984 | McKay | 324/318 |

FOREIGN PATENT DOCUMENTS

| | | | |
|---|---|---|---|
| 119831 | 9/1981 | Japan | 324/322 |
| 182350 | 10/1984 | Japan | 324/322 |

OTHER PUBLICATIONS

Article Entitled "A New Double-Tuned Probe for Current $^1$H and $^{31}$P NMR", by M. D. Schnall et al., Journal of Magnetic Resonance 65, pp. 122-129, (1985).

Primary Examiner—Stewart J. Levy
Assistant Examiner—Kevin D. O'Shea
Attorney, Agent, or Firm—Sandler & Greenblum

[57] ABSTRACT

A radio frequency RF balanced coil for magnetic resonance operations. The coil is tuned to a plurality of frequencies for use in acquiring data of different elements at various frequencies without having to remove and/or return the coil. The coil has a single terminal pair and is coupled to the MR system with a single shielded cable.

11 Claims, 2 Drawing Sheets

MULTI-FREQUENCY SURFACE PROBE

FIELD OF THE INVENTION

This invention is concerned with radio frequency coils or probes and more particularly with such probes known as surface probes used in magnetic resonance (MR) data acquisition systems.

BACKGROUND OF THE INVENTION

This invention is related to an earlier invention entitled "Dual Frequency Surface Coils" and assigned to the assignee of this invention. The prior invention was described in a patent application filed in the U.S. on Mar. 19, 1985 which received Ser. No. 713,689 U.S. Pat. No. 4,691,163 issued on the noted application on Sept. 1, 1987.

In MR data acquisition systems, radio frequency (RF) coils or probes are used to transmit RF pulses which tip or perturb nuclei ("spins") that have been aligned by static magnetic fields. After the RF pulses are removed, the perturbed nuclei tend to dephase and to subsequently return to their former aligned positions. When RF pulses of proper magnitude and frequency are applied and certain gradient pulses or combinations of RF and gradient pulses are applied the nuclei are rephased and RF echo signals are generated. These signals are detected by RF coils and provide data used to generate display images, for example. The most commonly perturbed element in magnetic resonance imaging (MRI) is hydrogen. Other elements are also perturbed, such as, for example, carbon. Also for a long time it has been known that phosphor can provide unique information. Thus, phosphor has been perturbed to obtain magnetic resonance MR spectroscopic data. For example, it is believed that there may be an abnormal abundance of phosphate in tissue that is tumorous. Accordingly, during some MRI procedures it is useful to obtain MR data based on the presence of phosphor in the patient.

Surface coils are special RF probes that are designed to operate when juxtaposed to a portion of the patient. The proximity improves the effect of the RF signal. For example, surface coils are used to obtain images of a female patient's breast using the echo signals of hydrogen nuclei. By using another frequency, the phosphor nuclei are perturbed and spectroscopic data is obtained showing whether there is an abnormal accumulation of phosphor in the breast. If such an accumulation is found it may be a reliable, early indication that a cancerous condition exists. This indication is obtainable long before other known tests for cancer can provide reliable data. The early detection of cancer is necessary for effecting a cure. Thus, it is extremely important to obtain such information as soon as possible.

In the past, it has been possible to first obtain the MRI data using one RF surface coil or probe tuned for the Larmor frequency of hydrogen and subsequently obtaining phosphor spectrometric data using another RF probe tuned for the Larmor frequency of phosphor. The different coils were used since different frequencies are necessary to perturb the different nuclei. It has not been common to use the same coil for the different frequencies because, among other things, of the difficulties in matching the impedance of the same probe to the characteristic impedances of the generator and receiver at different frequencies.

However, the use of the same coil has indeed been suggested for radio frequency probe operating at different frequencies in nuclear magnetic resonance. For example, U.S. Pat. No. 4,446,431 teaches a single coil for use at two frequencies. The tuning is accomplished remotely by using a transmission line wherein the high frequency signal is coupled at one point and the low frequency signal is coupled at another point on the transmission line.

The junction point for the low frequency signal in the single sample coil of the patent is extremely critical, as is the transmission line length. Another drawback of the double tuned single coil probe of the noted patent is that it has to be separately tuned for each sample being nutated or perturbed. When the probe is used for acquiring data of inanimate objects this presents more of an inconvenience than a problem. The inconvenience is largely due to the increase in throughput time. However, when the sample is a human being then the retuning for each patient is not only time consuming for the clinic which decreases throughput, but is also time consuming for the patient and detrimental to the patient's comfort.

The prior art also teaches the use of wide band probe arrangements for MR spectrometers. See for example U.S. Pat. Nos. 4,075,552 and 4,129,822. Both patents teach tunable tank or trap circuits that are individually tuned to obtain the MR frequencies of samples. The coil and associated circuitry are designed to match the impedances of both the transmitter and receiver at a wide range of frequencies. The U.S. Pat. No. 4,075,552 uses an autotransformer as the inductance of the tank circuit while the U.S. Pat. No. 4,129,822 uses a plurality of directly connected coils, in a series parallel arrangement with a switching arrangements for inserting and removing a coil for different frequency ranges.

The balanced surface coil of U.S. Pat. No. 4,691,163 represents an advancement in the art because, among other things, it can be used at two different frequencies without requiring separate tuning for each of the frequencies and it is not adversely loaded by the samples under test. Thus unlike other probes, the probe of that application does not require separate tuning for each sample or each change of distance between the sample and the coil.

The surface coil of application Ser. No. 713,689 required at least one pair of shielded cables. The cables of the pair of shielded cables are each connected to a different terminal of the balanced surface probe and the different frequency signals are both coupled to and from the probe at the same terminals by the single pair of shielded cables.

More recent prior art teaches multiple tuned probes using a separate trap circuit in series with the capacitor tuned sample coil for every desired resonant frequency. See for example an article entitled "A New Double-Tuned Probe for Concurrent 'H and "P NMR" by M. D. Schnall et al in the Journal of Magnetic Resonance, Vol. 65, pp. 122–129 (1985).

The noted prior art, including the U.S. patent application referred to hereinbefore in effect, teach either:

(1) Single coils or directly coupled coils with the resonant frequency being varied by variable capacitors, or inductors or combinations thereof;

(2) Circuits resonant at different frequencies depending on where the input/output leads are connected; or (3) The use of trap circuits to insure resonance at desired frequencies.

The prior art devices each suffer from some major defects. For example:

(1) In some prior art surface probes, it is necessary to tune the circuit each time the frequency is changed from high to low or vice-versa and/or either single or unbalanced coils are used in the RF probes. With probes made with unbalanced coils it may be necessary to tune the probe for each pateint. Periodic tuning operations may not be sufficient to set the tuning for a plurality of specimens or samples (patients);

(2) In some prior art surface probes, multiple shielded cables are necessary to connect each of the resonant frequencies going to and from the probe. This hampers the surface coils in addition to adding additional shielding cabling, (3) In some prior art surface probes, the efficiency of the probes at the higher frequency ('H) is less than 50%. Since the received signals in MR systems are inherently weak everything must be done to increase the efficiency of each part of the transmission and receiving systems, or (4) In some prior art surface probes, the optimum power transfer to and from the probe does not occur at each resonance frequency of the probe.

Accordingly, there is a need for surface probes for use in MR operations that can be used at a plurality of frequencies, without requiring separate tuning for each of the frequencies, without requiring separate shielded cables for each of the frequencies, which are efficiently matched to the basic line impedance for all of the frequencies and which perform efficiently and with a minimum of reactive components.

Therefore, it is an object of the present invention to provide radio frequency balanced probes for magnetic resonance operations which are tuned to a plurality of frequencies so that the probe can be used for acquiring MR data of different elements (hydrogen, carbon and/or phosphor nuclei, for example) and which transmit and receive signals and/or pulses at the various frequencies without the necessity of removing and/or retuning the probes between the uses of the different frequencies and which have a single terminal pair and use only a single shielded cable for connection to the MR system. Ideally the RF probe provided also will not require tuning when used on different patients.

BRIEF DESCRIPTION OF THE INVENTION

In accordance with the present invention a multi-radio frequency (RF) tuned surface probe for magnetic resonance (MR) data acquisition is provided, said probe comprising:

sampling coil means for transmitting and receiving RF pulses and signal in said MR data acquisition system, shielded cable means for connecting said pulses and signals to and from said sampling coil means.

tuning capacitor means in series with said sampling coil means for tuning said sampling coil, matching capacitor means coupled between the shielded cable and the shield of the shielded cable means, at least one parallel tuned circuit in series with said sampling coil for operating with the tuning capacitor and said sampling coil to provide at least two resonant frequencies, and coupling coil means coupling the shield of said shielded cable means to said sampling coil means to improve the efficiency of the power transfer at said at least two resonant frequencies.

A feature of the present invention provides radio frequency probes for magnetic resonance operations that are tuned to at least two frequencies and that are substantially independent of the impedances of the samples being perturbed.

A related feature of the present invention comprises the same means for connecting both said first and second frequency signals to the same single terminal pair on the tuned circuit.

BRIEF DESCRIPTION OF THE DRAWINGS

The above mentioned and other features and objects of the present invention will become more apparent by referring to the following description of broad aspects of the present invention taken in conjunction with the accompanying drawings, wherein.

GENERAL DESCRIPTION

Figure 1:
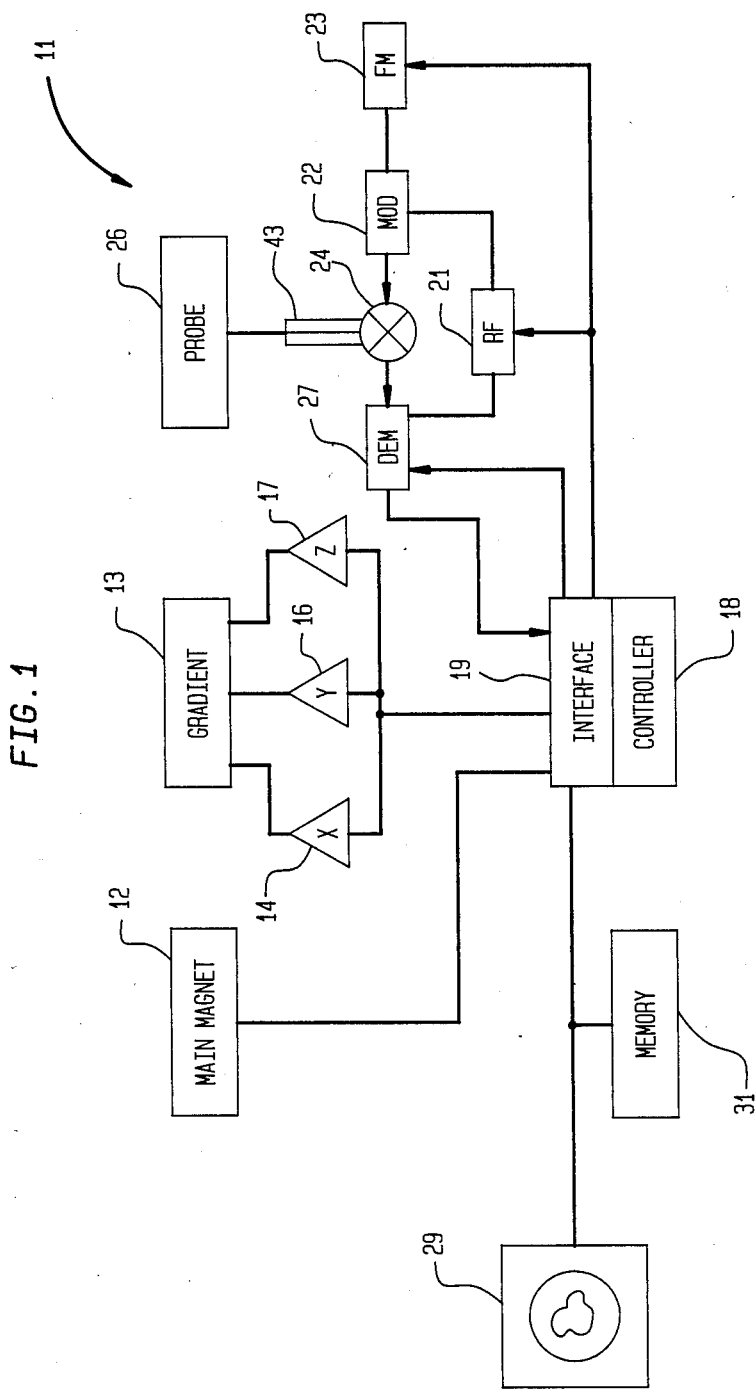
FIG. 1 is a block diagram showing of a magnetic resonance system connectable either in the receiving or the transmitting mode.

FIG. 1 at 11 shows an MR system which may be used for MR spectrometry and/or for MRI data acquisition purposes. Therein is shown the main magnet 12, which provides the static magnetic field that causes the nuclei being examined to assume an aligned state. Gradient magnets are indicated at 13. The gradient magnets are driven by the X gradient amplifier 14, the Y gradient amplifier 16, and the Z gradient amplifier 17, under the control of controller 18 operating through interface network 19, for example.

The gradients, as is well known, are used to locate the portion of the subject being imaged. With the gradients selectively energized, a radio frequency (RF) probe is pulsed to perturb the nuclei of the desired element. This is accomplished by using an RF pulse of a given frequency according to the Larmor relationship. For example, to perturb hydrogen elements a frequency of 42.5 MHz is used in a one Tesla field. An RF generator 21 operates at the selected frequency. Its output is supplied to a modulator 22 which is also operated on by a function generator 23 to provide a shaped RF pulse, that is transmitted through a switching means 24 to RF probe 26.

The same probe may be used to detect 'FID' or echo signals. The detected signals are transferred by a shielded cable 43 through the switching means 24 to a demodulating circuit 27. The demodulating circuit has another input from the RF generator 21. The signal output of the demodulator is coupled to the controller where the signal is used as data for imaging and/or for spectroscopy. The imaging data is used to form an image for display purposes on display circuit 29 in combination with the memory means 31.

If additional data is wanted for example if carbon nuclei or phosphate nuclei are to be perturbed then different radio frequencies must be used in accordance with the well known Larmor relationship.

Figure 2:
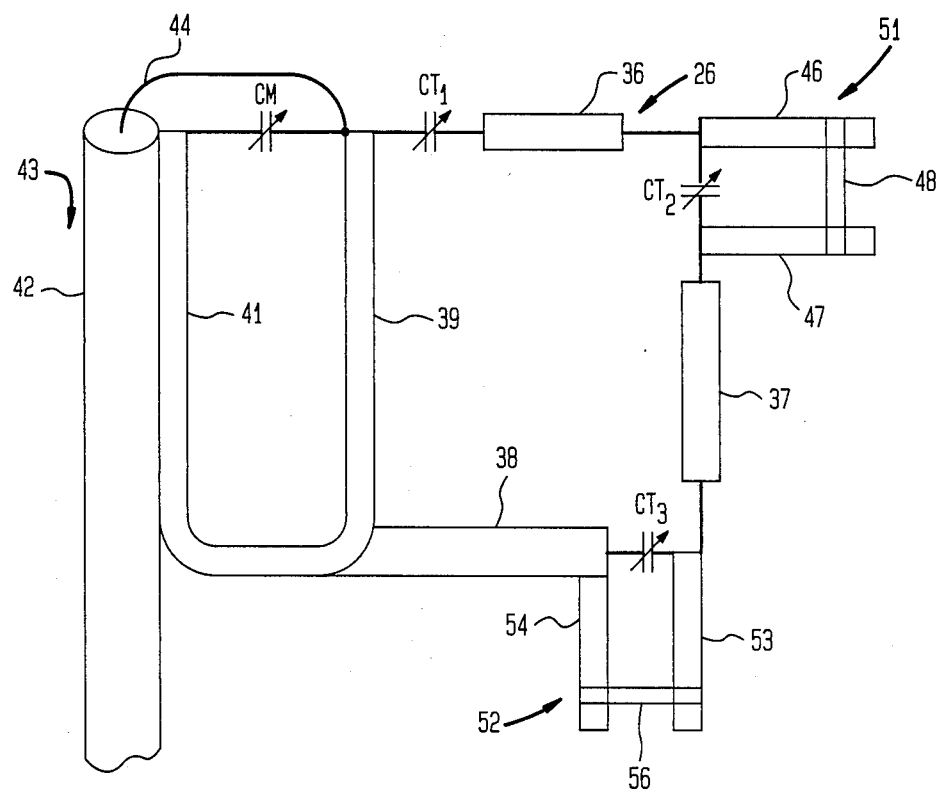
FIG. 2 is a pictorial plan view showing of an embodiment of the inventive probe.

FIG. 2 is used to demonstrate coils or probes which are connected at a single terminal pair to have a plurality of resonant frequencies and retain a characteristic impedance. For practical purposes to use the same probe for at least two different resonant frequencies it is important that the probes resonate at both desired frequencies and also have matching impedance at both frequencies.

The pictorial plan view of FIG. 2 shows a distributed sampling coil arrangement in the multi-frequency tuned surface probe. The probe comprises a coil 26. The coil is distributed between coil portions 36, 37, 38, and 39. The four coil portions are shown distributed and placed in a square loop arrangement. The inventive concept includes among other arrangements circular, rectangular and ellipsoidal arrangements.

In a preferred embodiment the coil portions are each copper straps approximately 12 cm in length and about ⅜ of an inch wide. Tuning capacitors are located between the coil portions; such as capacitor CT1 connecting coil portions 39 and 36. In a similar manner capacitor CT2 connects coil portions 36, 37 and capacitor CT3 connects coil portions 37 and 38.

A matching capacitor CM is coupled between coil portion 39 and a coupling coil 41. The coupling coil acts as a broad band impedance matching transformer. As shown in FIG. 2 for most of its lengths the coupling coil 41 is attached to the shield 42 of shielded cable 43. The cable 44 of shielded cable 43 is connected to the junction of matching capacitor CM and sampling coil portion 39. The sampling coil portion 39 and the capacitor CT1 are tuned to one of the plurality of radio frequencies that are used for transmitting pulses and receiving signals to manipulate spins and obtain desired F.I.D. signals or echos from the sample under test.

Means are provided for tuning to alternate frequencies. For example, attached to opposite sides of capacitor CT2 are a pair of parallel copper strips. The parallel copper strips are tuned coiled portions 46 and 47. These tuned coil portions are attached together by a movable strip 48 which may be used to vary the inductance and accordingly the tuned frequency of the trap or tank circuit 51. The trap circuit 51 is comprised of the inductors 46 and 47 in series bridged by capacitor CT2. The trap circuit 51 is tuned for another one of the desired plurality of frequencies.

If another frequency is desired then a similar inductor bridged by capacitor CT3 is used to form trap circuit 52. The trap circuit 52 is comprised of inductors 53 and 54 attached to opposite sides of capacitor CT3 and joined by a movable strip 56 for varying the inductance and thereby tuning the trap circuit 52 to a desired one of the multiple frequencies.

Other trap circuits could be used in series with the basic sampling coil arrangement 26 to provide even more resonant frequencies. In one preferred embodiment CT1 is 75 pfd, CT2 is 105 pfd, CT3 is 180 pfd. The copper strips 46, 47, are about 6 cm. long while the strips 53 and 54 are 4 cm. long. Matching capacitor CM is approximately 51 pfd. The shielded cable has a 50 ohm characteristic impedance. The preferred embodiment shown in FIG. 2 is matched from 10 to 90 MHz. The basic sample coil is tuned for 81 MHz. The tank circuit 51 is tuned for 34 MHz. and tank circuit 52 is tuned for 62 Mhz.

Figure 3:
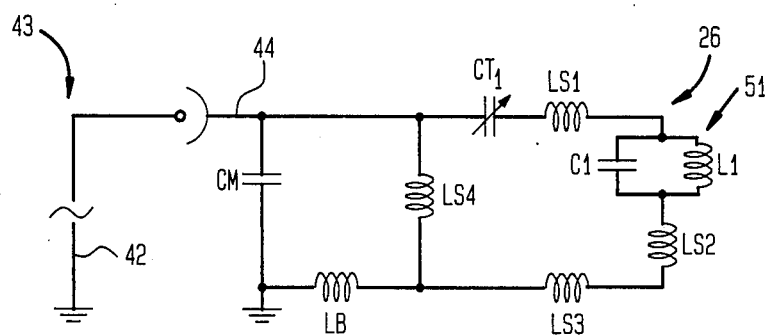
FIG. 3 is a schematic equivalent showing of a generalized embodiment of a multiple coil balanced RF probe which resonates at a plurality of different radio frequencies.

The equivalent circuit of FIG. 3 shows the probe 26 as comprised of a distributed sampling coil comprised of inductor LS1, LS2, LS3, LS4, arranged in a square loop pattern. Between inductor LS1 and inductor LS4 is capacitor CT1. In series between inductor LS1 and LS2 is the trap circuit 51 comprised of capacitor C1 and inductor L1 in parallel. Inductor LS2 is connected to inductor LS3 which is connected to the junction of the inductor LS4 and coupling coil or inductor LB which acts as a broad band impedance matching transformer. Coil LB is coupled to the ground end of the matching capacitor CM. The other end of the matching capacitor is connected to the cable 44 of the shielded cable 43; while the shield 42 is connected to ground or to the other end of the coupling coil LB.

If other resonant frequencies are desired, other tank or trap circuits such as 51 are installed in series with the distributed inductor arrangement. The coupling inductor LB in this arrangement broadens the frequency band so that tuning is possible over a very wide range at a very high efficiency not previously achieved in the prior art surface probe arrangements such as that discussed in the noted article. The efficiency of the coil of the article at the high end, that is for example when tuned to the 80 MHz was less than 50%, with the inventive arrangement higher efficiency is achieved throughout the band. In addition the characteristic impedance remains substantially constant throughout the band.

In operation then the system 11 of FIG. 1 is connected to the probe 26. The probe 26 is used in conjunction with a patient for example within the main magnet. The capacitor CT1 is varied to tune the probe to a particular frequency, say the Lamor frequency of hydrogen, at the magnetic field strength of the main magnet 12. The trap circuit 51 is tuned for the Lamor frequency of phosphor and the trap circuit 52 is tuned for the Lamor frequency of carbon. The tuning remains quite constant for long periods of time and is not effected by the subject. Thus the coil does not have to be returned for each new subject or for each new position of the probe during the test.

While the invention has been explained using specific embodiments, it should be understood that these embodiments are described by way of example only and not as a limitation on the scope of the invention which is defined by the accompanying claims.

What is claimed is:
1. A multi-frequency tuned surface probe comprising:
   sampling coil means for transmitting and receiving RF pulses and signals,
   shield cable means for transferring said pulses and said signals to and from said sampling coil means,
   tuning capacitor means in series in said sampling coil means for tuning said probe to a first desired resonant frequency,
   at least one parallel tuned circuit in series in said sampling
   coil for tuning said probe to another desired resonant frequency,
   matching capacitor means coupled between the shielded cable and the shield, and
   said sampling coil means coupled to the shield of the said shielded cable through coupling coil means.
2. The probe of claim 1 wherein said coupling coil means is a broad band matching transformer.
3. The probe of claim 1 wherein said sampling coil comprises distributed sampling inductors.
4. The probe of claim 3 wherein said distributed sampling inductors are arranged symmetrically in four quadrants.
5. The probe of claim 3 wherein one sampling inductor is located in each of said four quadrants.
6. The probe of claim 3 wherein said distributed sampling inductors form a square like loop.

7. The probe of claim 3 wherein said sampling inductors comprise copper straps.

8. The probes of claim 3 wherein said parallel tuned circuit includes tuning inductors comprised of copper straps.

9. The probe of claim 3 wherein said coupling coil means comprises a copper strap.

10. The probe of claim 8 wherein said copper straps are co-planar.

11. The probe of claim 3 wherein said coupling coil is attached to the shield of said shielded cable for most of the length of said coupling coil.

* * * * *